United States Patent [19]

Linde et al.

[11] Patent Number: 5,043,789

[45] Date of Patent: Aug. 27, 1991

[54] PLANARIZING SILSESQUIOXANE COPOLYMER COATING

[75] Inventors: Harold G. Linde; Rosemary A. Previti-Kelly, both of Richmond, Vt.

[73] Assignee: International Business Machines Corporation, Armonk, N.Y.

[21] Appl. No.: 494,006

[22] Filed: Mar. 15, 1990

[51] Int. Cl.$^5$ .................... H01L 21/47; H01L 21/56; H01L 29/34

[52] U.S. Cl. .................... 357/52; 148/33.3; 427/387; 437/235; 437/243

[58] Field of Search ............ 148/33.3, DIG. 81; 427/387; 437/235, 243; 357/52

[56] References Cited

U.S. PATENT DOCUMENTS

| | | | |
|---|---|---|---|
| 276,597 | 11/1888 | Clodgo et al. | 148/33.3 |
| 4,222,792 | 9/1980 | Lever et al. | 148/1.5 |
| 4,349,609 | 9/1982 | Takeda et al. | 428/429 |
| 4,480,009 | 10/1984 | Berger | 428/447 |
| 4,626,556 | 12/1986 | Nozue et al. | 522/99 |
| 4,670,299 | 6/1987 | Fukuyama et al. | 427/96 |
| 4,723,978 | 2/1988 | Clodgo et al. | 65/31 |
| 4,801,507 | 1/1989 | Estes et al. | 428/450 |
| 4,981,530 | 1/1991 | Clodgo et al. | 437/243 X |

OTHER PUBLICATIONS

Clodgo, D. J., et al., "Polysiloxane Dielectric for Multi-Level Metal", IBM Tech. Discl. Bull., vol. 28, No. 12 (May 1986), p. 5246.

Primary Examiner—Michael Lusignan
Attorney, Agent, or Firm—Willliam D. Sabo

[57] ABSTRACT

An improved insulating layer is formed by applying to a suitable substrate an organic solution, prepared by reacting an aminoalkoxysilane monomer, an arylalkoxysilane or arylsilazane monomer and water in a solvent, and then heating the coated substrate under conditions so as to evaporate the solvent and form a layer of cured ladder-type silsesquioxane copolymer. The insulating layer, which demonstrates excellent planarizing and thermal stability characteristics, is particularly useful in semiconductor device applications.

22 Claims, No Drawings

PLANARIZING SILSESQUIOXANE COPOLYMER COATING

BACKGROUND OF THE INVENTION

1. Field of the Invention

This invention relates to an improved insulating layer, and, more particularly, to a method of forming an insulating layer of a ladder-type silsesquioxane copolymer, derived from an aminoalkoxysilane and an arylalkoxysilane, and which demonstrates improved planarizing and thermal stability properties.

2. Description of the Prior Art

In the field of semiconductor processing, it is well known to use organic materials as insulating layers. In particular, polyimide resins have been widely used for this purpose. However, it has been found that the polyimide resins, which have been used, while suitable in many respects, tend to exhibit rather poor planarizing characteristics over topographic obstructions. Because of these and other problems, the use of other organic materials, such as organosilanes, has been investigated.

For example, in IBM Tech. Discl. Bull., Vol. 28, No. 12, p. 5246 (May 1986), a polysiloxane dielectric is formed on a polyimide layer by spin-applying and then heat treating a hydrolyzed organosilane monomer (e.g., an aqueous solution of 3-aminopropyltriethoxysilane).

Also, in U.S. Pat. No. 4,480,009, issued to Berger on Oct. 30, 1984, selected polysiloxane units are incorporated into polyimides for the purpose of forming protective coatings with improved adhesion properties.

See also U.S. Pat. No. 4,222,792, issued to Lever et al. on Aug. 15, 1982, where an organosilane (i.e., a polysiloxane) is used as a fill material in the formation of planar, deep isolation trenches.

However, it has been found that the polysiloxanes, while generally having planarizing characteristics which improve upon the polyimides, have demonstrated stress-induced cracking and relatively poor adhesion.

Recently, another type of organosilane—namely, a silsesquioxane polymer—has been introduced into the art for use as an insulating layer. For example, in U.S. Pat. No. 4,349,609, issued to Takeda et al. on Sept. 14, 1982, cured coatings of non-amino-containing ladder-type silsesquioxane polymers, either alone or in admixture with silanol or titanol compounds, are employed as interlayer insulating layers between metal wiring layers.

There are a number of problems, however, with the approach in Takeda et al. For instance, such systems must be stored at low temperatures to retard aging, and they have a limited shelf-life despite such precautions, leading to increased costs and process control problems in use. Also, the addition of silanol starting materials into the system tends to degrade the dielectric properties of the resulting layer.

U.S. Pat. No. 4,626,556, issued to Nozue et al. on Dec. 2, 1986, also discloses the formation of a non-amino-containing silsesquioxane polymer layer. According to the process in this patent, water is reacted with a trihalogenosilane in the production of an organopolysilsesquioxane, which is used in a mixture with a compound which generates crosslinking-reaction-active species upon irradiation, in the formation of a patterned insulating layer.

In U.S. Pat. No. 4,723,978, issued to Clodgo et al. on Feb. 9, 1988, an organoglass insulating layer is produced by first forming a modified ladder-type silsesquioxane polymer from a silanol solution, and then treating it in an oxygen plasma.

Other insulating layers of silsesquioxane polymers are formed in the following references:

U.S. Pat. No. 4,670,299, issued to Fukuyama et al. on Jun. 2, 1987, prepares a lower alkyl polysilsesquioxane by dissolving a lower alkyltrifunctional silane in an organic solvent at a temperature of $-20°$ to $-50°$ C. to form a solution, dropping water into the solution under an inert gas pressurized at 1,000 to 3,000 Pa, and gradually heating the solution to a temperature of 60° to 100° C.

U.S. Pat. No. 4,801,507, issued to Estes et al. on Jan. 31, 1989, reacts an aryltrifunctional silanetriol (e.g. phenyltrichlorosilane) with a tetrafunctional silicic acid compound (e.g. ethyl silicate) to form a polymer rich in siloxane units.

For a variety of reasons, none of the foregoing techniques has proven to be entirely satisfactory.

In order to obtain an improvement in planarizing properties, the method in U.S. Pat. application Ser. No. 276,597, filed by Clodgo et al. on Nov. 28, 1988, now U.S. Pat. No. 4,981,530, forms an insulating layer by first preparing a solution by reacting water with an aminoalkoxysilane monomer in a solvent, by employing a critical mole ratio of water/monomer ranging from about 1.3/1–1.7/1. After the solution is allowed to sufficiently age, it is coated on a suitable substrate, which is then heated in an essentially oxygen-free atmosphere and under such conditions as to form a layer of cured ladder-type silsesquioxane polymer. In the practice of the method, an insulating layer is produced, which can achieve a high degree of planarization with improved crack resistance, however, in many applications, it is desirable to produce an insulating layer which demonstrates, not only desirable planarization characteristics, but also enhanced thermal stability.

BRIEF SUMMARY OF THE INVENTION

It is against this background that the present invention introduces a process for forming an improved insulating layer. In accordance with the invention, an organic solution is prepared by reacting an aminoalkoxysilane monomer, an arylalkoxysilane or arylsilazane monomer, and water in a solvent. The solution is applied to a suitable substrate, and the coated substrate is heated at a temperature and for a time as to evaporate the solvent and form a layer of cured ladder-type silsesquioxane copolymer. In the practice of the invention, an insulating layer is produced, demonstrating thermal stability above 400° C. and a high degree of planarization, while also demonstrating satisfactory crack resistance, adhesion and dielectric properties. For example, it has been found that the improved insulating layer can reduce topographic steps by more than 90 percent and, simultaneously, fill sub-micron gaps of high aspect ratio, without exhibiting crack-formation through thermal anneal to 475° C., while having a dielectric constant and dissipation factor generally equivalent to those commonly exhibited by cured polyimides. In a preferred application, a semiconductor device is produced, incorporating an improved insulating layer, prepared according to the process of the invention.

DETAILED DESCRIPTION

In forming the insulating layer according to the process of the invention, an organic solution is applied to a suitable substrate. This solution is prepared by reacting an aminoalkoxysilane monomer, an arylalkoxysilane or arylsilazane monomer and water in a solvent. Suitable aminoalkoxysilane monomers include aminotrialkoxysilanes represented by the formula:

$$HN\underset{\underset{R_1}{|}}{-}R_2-Si(OR_3)_3 \qquad (A)$$

wherein $R_1$ is a hydrogen atom; a saturated hydrocarbon residue or an amino-substituted, saturated hydrocarbon residue, preferably having 1 to 5 carbon atoms; or a phenyl group or an alkyl-substituted phenyl group or derivatives thereof, the alkyl group preferably having 1 to 5 carbon atoms; wherein $R_2$ is a saturated hydrocarbon residue, preferably having 2 to 6 carbon atoms; and wherein $R_3$ is a saturated hydrocarbon residue, preferably having 1 to 5 carbon atoms. Also, mixtures of such aminotrialkoxysilanes can be used.

Preferred aminoalkoxysilane monomers include aminotrialkoxysilanes represented by the above formula (A), wherein $R_1$ is a hydrogen atom or a saturated hydrocarbon residue or an amino-substituted, saturated hydrocarbon residue, having 2 or 3 carbon atoms; wherein $R_2$ is a saturated hydrocarbon residue having 3 to 6 carbon atoms; and wherein $R_3$ is a saturated hydrocarbon residue having 1 to 4 carbon atoms.

A particularly preferred group of aminoalkoxysilane monomers includes the following aminotrialkoxysilanes: γ-aminopropyltrimethoxysilane, γ-aminopropyltriethoxysilane, N-β-(aminoethyl)-γ-aminopropyltrimethoxysilane and N-β-(aminoethyl)-γ-aminopropy triethoxysilane.

The arylalkoxysilane or arylsilazane monomer employed in preparing the solution is preferably represented by the formula:

$$R_4-Si-(Y)_3 \qquad (B)$$

wherein $R_4$ is an unsubstituted or substituted aromatic residue, such as $$CH_3(CH_2)_nC_6H_4 \qquad (C)$$

wherein n=0–6, and more preferably 0–3, e.g. benzyl, xylyl, mesitylyl or higher functionalities; and wherein Y is $(OR_5)$ or $N(R_6)_2$, wherein $R_5$ is a saturated hydrocarbon residue having 1 to 5 carbon atoms and $R_6$ is a hydrogen atom or a saturated hydrocarbon residue having 1 to 5 carbon atoms. Also, mixtures of such arylalkoxysilanes and arylsilazanes can be used.

Particularly preferred arylalkoxysilane and arylsilazane monomers include those in which $R_4$ is an unsubstituted or substituted phenyl group and $R_5$ is a saturated hydrocarbon residue having 1 to 4 carbon atoms or $R_6$ is a hydrogen atom or a saturated hydrocarbon residue having 1 to 4 carbon atoms. Arylalkoxysilane monomers are most preferred, such as phenyltrialkoxysilane, e.g. phenyltriethoxysilane.

Any suitable solvent which can dissolve the aminoalkoxysilane and the arylalkoxysilane or arylsilazane and is miscible with water can be employed. Typical solvents include, for example, alcohols, such as methanol, ethanol, propanol, isopropanol, butanol, isobutanol, isoamyl alcohol, and the like; ethers, such as the cellosolves, e.g. methyl cellosolve, diglyme, dioxane, butyl carbitol, tetrahydrofuran, and the like; aromatic alcohols, such as phenol, and the like; polyhydric alcohols, such as ethylene glycol, tetramethylene glycol, and the like; ketones, such as methyl ethyl ketone, methyl isobutyl ketone, diethyl ketone, and the like; etc., as well as mixtures thereof, as will be apparent to those skilled in the art. Preferred solvents include methanol, ethanol and isopropanol.

Preferably, the reaction is carried out by employing a mole ratio of arylalkoxysilane monomer to aminoalkoxysilane monomer in the range from about 1:3 to about 4:1, more preferably from about 2:3 to about 2.5:1, and a mole ratio of water/total monomer in the range from about 0.5:1 to about 2:1, more preferably from about 0.9:1 to about 1.7:1.

To modify the properties of the resulting insulating layer, other monomers may be added in preparing the organic solution. For example, to improve uniformity of the layer, higher functionality silane monomers, such as tetrafunctional silane monomers, which facilitate cross-linking, may be employed. In a particularly preferred embodiment of the invention, the organic solution is prepared by reacting, in addition to the aminoalkoxysilane and arylalkoxysilane or arylsilazane monomers and water, a tetraalkoxysilane monomer, such as tetraethoxysilane. Preferably, the tetraalkoxysilane monomer is employed in a proportion up to about 50 percent, more preferably up to about 45 percent, and most preferably about 20 to about 45 percent, based on the moles of total monomer.

In order to facilitate control of the formation of reactive silanol species, it is preferred to first dissolve the arylalkoxysilane or arylsilazane monomer in the solvent, and then add the desired amount of water. In general, the concentration of the solution of the arylalkoxysilane or arylsilazane monomer in the solvent can vary over a wide range, but preferably from about 0.5 to about 50 parts by volume of solvent per part by volume of the arylalkoxysilane or arylsilazane is utilized.

Next, the aminoalkoxysilane monomer is added to the solution, which is then allowed to age for a period of time which is sufficient to allow condensation reactions to stabilize and formation of ladder-type oligomers. In general, the length of the aging period can vary broadly, depending upon the aminoalkoxysilane, the arylalkoxysilane or arysilazane and the solvent used, the solvent concentration, the amount of water added, temperature, etc. Typically, however, the aging period is at least about 2 hours, and preferably ranges from about 8 to about 72 hours.

The organic solution is then coated onto a suitable substrate, such as a surface of a microelectronic device, e.g. a semiconductor. The nature of the surface, which is coated, is not critical so long as the aged solution will adhere to it. Thus, the surface may be, for example, an organic insulation layer (e.g., polyimides) or an inorganic substrate, such as Si, $SiO_2$, $Si_3N_4$, $Al_2O_3$ or common metallurgies, such as Al, Cu, Ti, Cr, W or alloys, and so forth.

The organic solution is applied to the surface to be coated in a conventional fashion. Typically, it is spun onto the desired surface, at a spin speed within the range from about 2,000–5,000 rpm, depending upon the desired thickness of the coating, which generally ranges from about 1,000 to about 15,000 ↑.

After application of the organic solution, the layer is heated to effect formation of a ladder-type silsesquioxane copolymer. The actual curing conditions, i.e. temperature, pressure and time, may vary over wide ranges and are generally dependent on the aminoalkoxysilane and the arylalkoxysilane or arylsilazane employed, the water/monomer ratio, the desired thickness of the cured layer being produced, and other factors, which should be apparent to those skilled in the art. In general, however, temperatures in excess of about 150° C. for a period of about 30 to about 120 minutes at atmospheric pressure are typical.

In a preferred embodiment for carrying out the process of the invention, the heat treatment is performed in a series of steps at atmospheric pressure. In this manner, the layer is exposed to a temperature of about 85-110° C. to drive off the solvent, and then successively increased temperatures in excess of about 200° C. to form the final cured layer.

As such, an improved insulating layer is achieved, which has a wide variety of uses, such as in semiconductor processing applications. The insulating layer demonstrates enhanced planarizing and thermal stability characterics over conventionally used polyimides, without associated adhesion problems. In addition, it has been found to be crack-resistant, while providing desirable electrical properties. The layer also exhibits desirable $O_2$-reactive ion etch resistance properties.

The following examples are provided to illustrate the invention. It should be noted that all operations specified in the examples were executed in a "Class 100" clean-room environment and in which the relative humidity was controlled to less than 50%.

COMPARATIVE EXAMPLE A

A 195 ml aliquot of dry (<0.01% $H_2O$) methanol was transferred into a clean, dry Nalgene (polyethylene) bottle. A 50 ml aliquot of high purity[1] 3-aminopropyltriethoxysilane[2] was added to the methanol, and the solution was thoroughly mixed with the cap in place to control exposure to the atmosphere. A 5.00 ml aliquot of deionized, distilled $H_2O$ was then slowly added with swirling of the silane/methanol solution, the bottle was capped, and the mixture was shaken vigorously for 10-20 seconds. The closed container was placed on a roller mill and mixed for 16 hours at room temperature. The aged solution was filtered using a 0.2$\mu$ polypropylene filter under conditions ensuring minimal atmospheric exposure.

About 10 ml of the aged, filtered solution was added to the surface of a 10 cm (diameter) silicon substrate wafer by discharge through a point-of-use, 0.2$\mu$ filter directly onto the substrate surface, effectively covering 80-100% of the substrate surface area. The wafer was
1. Monomer content >99.5% (Gas Chromatography), and total ionics' concentration <5 ppm.
2. Commercially available from Union Carbide under the designation "A1100". spin-accelerated on an MTI spin-apply tool (MTI Corp.) after a post-apply "dwell" period (quiescent state) of about 10 seconds. The acceleration was controlled to about 400 rpm/sec to a final spin-speed of about 3,000 rpm, where the final speed was maintained for about 25 sec.

The wafer was transferred to an MTI hotplate (MTI Corp.), providing an approximate hot-plate exposure, and was baked in air at a temperature of about 105° C. for 12 min. to remove excess solvent. The wafer was then transferred to a quartz carrier and into a Corso-Gray furnace equipped with a quartz furnace tube and automated cantilever transfer mechanism designed to control the movement of the carrier into and out of the tube with a minimum of particulate contamination. A program was used to move the carrier through a series of temperature zones within the furnace (as summarized in the table below). Throughout the oven cure, a flow of dry nitrogen, filtered to eliminate particulates >0.2$\mu$ in diameter, was maintained to minimize substrate oxidation by controlling the oxygen content of the tube to <10 ppm in all zones where the temperature was >150° C. The ramp-sequence through the oven tube was as follows:

| ZONE | TEMP. (°C.) | TIME (Min.) |
| --- | --- | --- |
| 1 | 95 | 10 |
| 2 | 112 | 10 |
| 3 | 116 | 10 |
| 4 | 150 | 10 |
| 5 | 210 | 10 |
| 6 | 280 | 10 |
| 7 | 320 | 10 |
| 8 | 350 | 30 |

After the (combined) 100 min. oven-cure in $N_2$, the carrier was withdrawn to the first zone (95° C.) in flowing $N_2$, where the carrier and substrate were permitted to cool to less than 150° C., at which point the substrate was removed from the furnace.

The above-noted procedure produced a cured silsesquioxane film approximately 4000 Å thick as measured by ellipsometry and presented an infrared spectrum containing the characteristics of a silsesquioxane polymer having a significant, bulk "ladder-type" structure, as measured by FTIR. Using standard MOS-type substrate monitors, the dielectric properties of the film were measured. The dielectric breakdown was >6 MV/cm, the dielectric constant was about 3.4 (400 KHz), and the dissipation factor was 0.06 (400 KHz). The intrinsic film stress was tensile and <$10^8$ dynes/cm[2,] as measured by a Tropel optical flatness testor.

EXAMPLE 1

A 195 ml aliquot of dry (<0.01% $H_2O$) methanol was transferred into a clean, dry Nalgene (polyethylene) bottle. A 25 ml aliquot of high purity[1] phenyltriethoxysilane[2] was added to the methanol, and the solution was thoroughly mixed with the cap in place to control exposure to the atmosphere. A 5.00 ml aliquot of deionized, $H_2O$ was then slowly added with swirling of the silane/methanol solution, the bottle was capped, and the mixture was shaken vigorously for 10-20 seconds. A magnetic stir bar was placed in the solution and the bottle placed on a magnetic stirrer. At this time 25 ml of high purity[1] 3-aminopropyltriethoxysilane[3] was placed in a polypropylene addition funnel and connected to the bottle, and it was added over the course of 1 hour with good stirring. After addition the bottle was placed on a roller mill and mixed for 16 hours. The aged solution was filtered using a 0.2$\mu$ polypropylene filter under conditions ensuring minimal atmospheric exposure.

About 10 ml of the aged, filtered solution was added to the surface of a 10 cm (diameter) silicon substrate wafer by discharge through a point-of-use, 0.2$\mu$ filter directly onto the substrate surface, effectively covering 80-100% of the substrate surface area. The wafer was
1. Monomer content >99.5% (Gas Chromatography), and total ionics' concentration <5 ppm.
2. Commercially available from Petrarch Systems, Inc. under the designation "P0320".
3. Commercially available from Union Carbide under the designation "A1100".

spin-accelerated on a Convac apply-bake tool after a post-apply "dwell" period (quiescent state) of about 10 seconds. The acceleration was controlled to about 400 rpm/sec to a final spin-speed of about 3,000 rpm, where the final speed was maintained for about 25 sec.

The wafer was transferred to a bake track, providing an approximate hot-plate exposure, and was baked in air at a temperature of about 100° C. for 10 min. to remove excess solvent. The wafer was then transferred to a quartz carrier and into a Corso-Gray furnace equipped with a quartz furnace tube and automated cantilever transfer mechanism designed to control the movement of the carrier into and out of the tube with a minimum of particulate contamination. A program was used to move the carrier through a series of temperature zones within the furnace, as shown in the table for Comparative Example A. Throughout the oven cure, a flow of dry nitrogen, filtered to eliminate particulates >0.2μ in diameter, was maintained to minimize substrate oxidation by controlling the oxygen content of the tube to <10 ppm in all zones where the temperature was >150° C.

After the (combined) 100 min. oven-cure in $N_2$, the carrier was withdrawn to the first zone (95° C.) in flowing $N_2$, where the carrier and substrate were permitted to cool to less than 150° C., at which point the substrate was removed from the furnace.

The above-noted procedure produced a cured silsesquioxane film approximately 7800 Å thick as measured by ellipsometry and presented an infrared spectrum containing the characteristics of a silsesquioxane polymer having a significant, bulk "ladder-type" structure, as measured by FTIR. Using standard MOS-type substrate monitors, the dielectric properties of the film were measured. The dielectric constant was about 3.2 (400 KHz) and the dissipation factor was 0.06 (400 KHz). The intrinsic film stress was tensile and <108 dynes/cm$^2$, as measured by a Tropel optical flatness testor.

EXAMPLES 2-4

The procedure of Example 1 was followed, except that different proportions of the reactants were employed. The proportions, as expressed in mole percents, of the reactants, and the properties of the cured silsesquioxane films, are summarized in Table I and Table II below.

COMPARATIVE EXAMPLES B-D

The procedure of Example 1 was followed, except that different proportions of the reactants were employed. In particular, a relatively low amount of phenyltriethoxysilane was used. The results showed that the cured silsesquioxane films of these three comparative examples, like the film of Comparative Example A, had unacceptable thermal stability characteristics. The proportions, as expressed in mole percents, of the reactants, and the properties of the cured silsesquioxane films, are summarized in Table I and Table II below.

EXAMPLES 5-8

The procedure of Example 1 was followed, except that different proportions of the reactants were employed and an additional monomer, tetraethoxysilane (TEOS), was added to the solution. The results showed improvements in the uniformity and the etch rate ratio of the resulting cured films. The proportions, as expressed in mole percents, of the reactants, and the properties of the cured silsesquioxane films, are summarized in Table I and Table II below.

TABLE I

| EXAMPLE OR COMPARATIVE EXAMPLE | COMPOSITION OF SOLUTION (MOLE PERCENT) | | | | % SOLIDS IN MeOH |
|---|---|---|---|---|---|
| | A[1] | B[2] | C[3] | $H_2O$ | |
| CE-A | 43.6 | — | — | 56.4 | 20 |
| 1 | 21.9 | 21.2 | — | 56.9 | 20 |
| 2 | 30.6 | 12.7 | — | 56.7 | 20 |
| 3 | 26.3 | 17.0 | — | 56.7 | 20 |
| 4 | 11.1 | 31.8 | — | 57.1 | 20 |
| CE-B | 41.5 | 2.0 | — | 56.5 | 20 |
| CE-C | 39.2 | 4.3 | — | 56.5 | 20 |
| CE-D | 35.0 | 8.4 | — | 56.5 | 20 |
| 5 | 18.5 | 17.9 | 15.5 | 48.0 | 2.0 |
| 6 | 20.1 | 19.4 | 8.4 | 52.1 | 2.0 |
| 7 | 21.6 | 20.8 | 1.8 | 55.8 | 2.0 |
| 8 | 8.6 | 17.1 | 17.1 | 57.1 | 2.0 |

[1]3-Aminopropyltriethoxysilane (Commercially available from Union Carbide under the designation "A1100")
[2]Phenyltriethoxysilane (Commercially available from Petrarch Systems, Inc. under the designation "PO320")
[3]Tetraethoxysilane (TEOS)

TABLE II

| EXAMPLE OR COMPARATIVE EXAMPLE | PROPERTIES | | | | |
|---|---|---|---|---|---|
| | THERMAL STABILITY[1] | SHRINKAGE[2] | ETCH RATE[3] | DIELECTRIC CONSTANT[4] | PLANARIZATION[5] |
| CE-A | 8.25 | 5.0 | 15 | 3.4 | >90% |
| 1 | 2.68 | 2.8 | 19 | 3.2 | >90% |
| 2 | 3.08 | 3.8 | — | 3.3 | >90% |
| 3 | 2.65 | — | — | — | >90% |
| 4 | 2.35 | 1.2 | — | 3.2 | >90% |
| CE-B | 8.14 | — | 20 | — | — |
| CE-C | 6.38 | — | 12 | — | — |
| CE-D | 4.25 | — | — | — | — |
| 5 | 3.70 | — | — | — | — |
| 6 | — | — | 26 | — | — |
| 7 | — | — | 26 | — | — |
| 8 | 2.64 | — | 8 | — | — |

[1]Percent weight loss (after 350° C. cure) on ramp to 400° C. at 1°/min.
[2]Percent film shrinkage at 380-400° C.
[3]Etch rate (Å/min.) in $O_2$ under the following conditions: hexode configuration/20$_2$ mtorr/1000 Watts/100 sccm.
[4]400 KHz
[5]Over a topographic step having a thickness of 0.7μ.

We claim:

1. A process for forming an insulating layer on a substrate, comprising the steps of:
   applying to said substrate an organic solution, prepared by reacting an aminoalkoxysilane monomer, an arylalkoxysilane or an arylsilazane monomer and water in an organic solvent; and
   heating said coated substrate at a temperature and for a time as to evaporate said solvent and form a layer of cured ladder-type silsesquioxane copolymer; and
   wherein said reaction is carried out by employing a mole ratio of arklyalkoxysilane or arylsilazane monomer to aminoalkoxysilane monomer in the range from about 1:3 to about 4:1 and a mole ratio of water/total monomer in the range from about 0.5:1 to about 2:1.

2. The process of claim 1, wherein said aminoalkoxysilane monomer is an aminotrialkoxysilane represented by the formula:

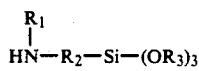

wherein:
   $R_1$ is a hydrogen atom; a saturated hydrocarbon residue or an amino-substituted, saturated hydrocarbon residue, having 1 to 5 carbon atoms; a phenyl group or an alkyl-substituted phenyl group or derivatives thereof, the alkyl group having 1 to 5 carbon atoms;
   $R_2$ is a saturated hydrocarbon residue having 2 to 6 carbon atoms; and
   $R_3$ is a saturated hydrocarbon residue having 1 to 5 carbon atoms;
or a mixture thereof.

3. The process of claim 1, wherein said arylalkoxysilane or arylsilazane monomer is represented by the formula, $R_4\text{-Si-}(Y)_3$, wherein $R_4$ is an unsubstituted or substituted aromatic residue and Y is $(OR_5)$ or $N(R_6)_2$, wherein $R_5$ is a saturated hydrocarbon residue having 1 to 5 carbon atoms and $R_6$ is a hydrogen atom or a saturated hydrocarbon residue having 1 to 5 carbon atoms.

4. The process of claim 1, wherein said solution is allowed to age for a period of at least about 2 hours, before application to said substrate.

5. The process of claim 1, wherein said reaction is carried out by employing a mole ratio of arylalkoxysilane monomer to aminoalkoxysilane monomer in the range from about 2:3 to about 2.5:1.

6. The process of claim 1, wherein said coated substate is heated in excess of about 150° C.

7. The process of claim 1, wherein said reaction is carried out by employing a mole ratio of water/total monomer in the range from about 0.9:1 to about 1.7:1.

8. The process of claim 1, wherein said solvent is selected from the group consisting of methanol, ethanol and isopropanol.

9. The process of claim 1, wherein said solution is prepared by first dissolving said arylalkoxysilane or arylsilazane monomer in said solvent, adding water, and then adding said aminoalkoxysilane monomer.

10. The process of claim 1, wherein said organic solution is prepared by reacting an aminoalkoxysilane monomer, an arylalkoxysilane or arylsilazane monomer, a tetraalkoxysilane monomer and water in a solvent.

11. The process of claim 10, wherein said tetraalkoxysilane monomer is tetraethoxysilane and is employed in a proportion of up to about 45 percent based on the moles of total monomer.

12. A process for forming an insulating layer on a substrate of a semiconductor device, comprising the steps of:
   dissolving an arylalkoxysilane or arylsilazane monomer in a solvent to form a solution of said monomer in said solvent, said arylalkoxysilane or arylsilazane monomer being represented by the formula, $R_4\text{—Si—}(Y)_3$, wherein $R_4$ is an unsubstituted or substituted phenyl group and Y is $OR_5$ or $N(R_6)_2$, wherein $R_5$ is a saturated hydrocarbon residue having 1 to 4 carbon atoms, and $R_6$ is a hydrogen atom or a saturated hydrocarbon residue having 1 to 4 carbon atoms;
   adding water to said solution;
   adding an aminotrialkoxysilane monomer to said solution, said aminotrialkoxysilane monomer being represented by the formula:

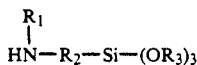

wherein:
   $R_1$ is a hydrogen atom or a saturated hydrocarbon residue or an amino-substituted, saturated hydrocarbon residue, having 2 or 3 carbon atoms;
   $R_2$ is a saturated hydrocarbon residue having 3 to 6 carbon atoms; and
   $R_3$ is a saturated hydrocarbon residue having 1 to 4 carbon atoms;
or a mixture thereof;
   wherein said mole ratio of arylalkoxysilane or arylsilazane monomer to aminoalkoxysilane monomer ranges from about 1:3 to about 4:1, and said mole ratio of water/total monomer ranges from about 0.5:1 to about 2:1;
   allowing said solution to age for a period of time which is sufficient to allow condensation reactions to stabilize;
   coating said substrate with a layer of said aged solution; and
   heating said coated substrate at a temperature and for a time as to evaporate said solvent and form a layer of cured ladder-type silsesquioxane copolymer.

13. The process of claim 12, wherein said mole ratio of arylalkoxysilane or arylsilazane monomer to aminoalkoxysilane monomer ranges from about 2:3 to about 2.5:1, and said mole ratio of water/total monomer ranges from about 0.9:1 to about 1.7:1.

14. The process of claim 13, wherein said aminotrialkoxysilane monomer is selected from the group consisting of γ-aminopropyltrimethoxysilane, γ-aminopropyltriethoxysilane, N-β-(aminoethyl)-γ-aminopropyltrimethoxysilane and N-β-(aminoethyl)-γ-aminopropyltriethoxysilane, and said arylalkoxysilane monomer is phenyltriethoxysilane.

15. The process of claim 14, wherein tetraethoxysilane is added to said solution and is employed in a proportion of about 20 to about 45 percent based on the moles of total monomer.

16. The process of claim 15, wherein said solvent is selected from the group consisting of methanol, ethanol and propanol; said solution is allowed to age for a period ranging from about 8 to about 72 hours; and said coated substrate is heated in excess of about 200° C.

17. An insulating layer prepared according to the process of claim 1.

18. An insulating layer prepared according to the process of claim 12.

19. An insulating layer prepared according to the process of claim 16.

20. A semiconductor device, comprising an insulating layer prepared according to the process of claim 1.

21. A semiconductor device, comprising an insulating layer prepared according to the process of claim 12.

22. A semiconductor device, comprising an insulating layer prepared according to the process of claim 16.

* * * * *